United States Patent
Kramer et al.

(10) Patent No.: US 7,989,263 B2
(45) Date of Patent: Aug. 2, 2011

(54) METHOD FOR MANUFACTURING A MICROMECHANICAL CHIP AND A COMPONENT HAVING A CHIP OF THIS TYPE

(75) Inventors: Torsten Kramer, Wannweil (DE);
Christoph Schelling, Stuttgart (DE);
Christina Leinenbach, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 124 days.

(21) Appl. No.: 12/584,148

(22) Filed: Aug. 31, 2009

(65) Prior Publication Data
US 2010/0084722 A1    Apr. 8, 2010

(30) Foreign Application Priority Data
Sep. 22, 2008    (DE) .................. 10 2008 042 258

(51) Int. Cl.
*H01L 21/00* (2006.01)
(52) U.S. Cl. .... 438/108; 438/48; 438/667; 257/E21.499
(58) Field of Classification Search .......... 438/106–127, 438/48–50, 667; 257/E21.499
See application file for complete search history.

(56) References Cited

U.S. PATENT DOCUMENTS

| | | | |
|---|---|---|---|
| 6,635,509 B1 * | 10/2003 | Ouellet | 438/106 |
| 6,743,654 B2 * | 6/2004 | Coffa et al. | 438/52 |
| 6,841,453 B2 * | 1/2005 | Mastromatteo | 438/455 |
| 7,572,660 B2 * | 8/2009 | Benzel et al. | 438/53 |

FOREIGN PATENT DOCUMENTS

| | | |
|---|---|---|
| DE | 102 05 026 | 5/2003 |
| DE | 103 59 217 | 7/2005 |
| DE | 10 2006 018 027 | 10/2007 |

* cited by examiner

*Primary Examiner* — Richard A. Booth
(74) *Attorney, Agent, or Firm* — Kenyon & Kenyon LLP

(57) ABSTRACT

In a method for manufacturing a micromechanical chip, a sacrificial layer and an epitaxy layer are initially applied to a semiconductor substrate to produce a layer stack. An opening is subsequently introduced into the epitaxy layer from the front side of the layer stack. In order to electrically insulate the subsequent filling of the opening using a conductive contact layer from the material of the epitaxy layer, the walls of the opening are provided with an insulating layer. For removing the sacrificial layer and thus for producing the chip, separation trenches are subsequently etched through the epitaxy layer to the sacrificial layer also from the front side of the layer stack, which separation trenches also delimit the lateral extension of the chip.

10 Claims, 4 Drawing Sheets

METHOD FOR MANUFACTURING A MICROMECHANICAL CHIP AND A COMPONENT HAVING A CHIP OF THIS TYPE

BACKGROUND OF THE INVENTION

1. Field of the Invention

The present invention relates to a method for manufacturing a micromechanical chip and a component which contains a chip of this type.

2. Description of Related Art

In flip chip technology, several methods for implementing through contacts are known in which a sensor element or a circuit on the front side of a semiconductor substrate is electrically connected to its back side. For example, a method is known from the German patent publication DE 102 05 026 A1 in which, with the aid of special insulation trenches, an area is produced in a substrate which is electrically isolated from the rest of the substrate. However, a through contact via doping is known from German patent publication DE 103 59 217 A1.

In addition, a method is also known from published German patent application document DE 10 2006 018027 A1 in which a via hole is initially produced in the substrate which is subsequently filled with a conductive material. For producing the through contact, the substrate is thinned from the back side up to the filled via hole.

BRIEF SUMMARY OF THE INVENTION

The present invention provides a method of manufacture of a micromechanical chip and a component which has a chip of this type, in which method a sacrificial layer and an epitaxy layer are initially applied to the substrate which is preferably made of a semiconductor material. At least one opening is subsequently introduced into the epitaxy layer from the front side of the layer stack produced in this way. In order to electrically insulate the subsequent filling of the opening with a conductive contact layer from the material of the epitaxy layer, the walls of the opening are provided with an insulation layer. For removing the sacrificial layer and thus for producing the chip, separation trenches are subsequently etched through the epitaxy layer up to the sacrificial layer, also from the front side of the layer stack. It is provided in particular that the separation trenches delimit the lateral extension of the chip.

The advantage of the present invention is that by removing the sacrificial layer a chip is produced which is isolated from the substrate.

Since the epitaxy layer essentially determines the vertical size of the chip, the height of the chip may be established in a defined manner by selecting the thickness of the epitaxy layer to be in the order of magnitude of 1 µm to 50 µm.

The contact trench and the separation trenches may advantageously be produced using an anisotropic etching process, a trench etching process, for example. The use of an anisotropic etching process of this type results in trenches having a high aspect ratio. It is also conceivable that both trenches are produced simultaneously, i.e., in one etching process, in order to achieve a quicker process execution.

Since the two trenches have to perform different functions, it is provided that the extension of the at least one contact trench is spatially delimited in both lateral directions, whereas, because of the intended separation effect, the extension of the separation trenches runs in one lateral direction, preferably across the total width of the chip. It is provided in particular that in each case two separation trenches meet at an intersection point, at an angle of almost 90°, for example.

The contact trenches filled with conductive material are used to make an electrical contact from the front side to the back side of the chip possible. It may advantageously be provided that multiple contact trenches are produced in the chip which are at a distance from each other and are electrically insulated.

During the manufacture of the chip, additional micromechanical processes (diffusion, metal-plating, CMOS processes, etc.) may be carried out, with the aid of which sensor elements and/or circuits or circuit parts are produced in the chip. It is conceivable here that the sensor elements or circuits are produced directly in the epitaxy layer, but also in layers additionally applied on the epitaxy layer. In a particular embodiment of the present invention, it is provided that a plurality of contact trenches is situated around the sensor element or the circuit. Moreover, it is advantageous to design the contact trenches as a Faraday shield. It may be provided in this case that the individual through contacts are connected to one another. However, there is also the option that the through contacts are electrically connected, in pairs or also alternatingly.

Filling of the contact trenches or deposition of a special contact layer for producing a through contact typically takes place via deposition methods, e.g., via an electrochemical method (e.g., a copper deposition) or via a known CVD method. In addition, however, PVD methods, remelting methods, or methods for producing the through contacts are also applicable.

In one embodiment of the present invention it is provided to produce the sacrificial layer having a pseudomorphous structure. It may optionally also be provided to use a conductive sacrificial layer. The use of SiGe as the sacrificial layer is also conceivable. The sacrificial layer is advantageously removed via a gas phase etching step, via a $ClF_3$ or $XeF_2$ etching, for example.

Particularly advantageous is the separation of the chip from the layer stack made up of the substrate, the sacrificial layer, and the epitaxy layer due to the combined use of the separation trenches and the removal of the sacrificial layer on which the chip is based. In this way, a plurality of individual chips may be produced on one substrate in one manufacturing process.

In a refinement of the present invention, the chips produced in this way may be used to form a chip stack. At least two chips are stacked on top of each other in such a way, preferably by using a permanent connecting method such as, for example, a bonding method, that the contact layers of the two chips are electrically contacted with one another. Particularly advantageous is an embodiment in which the bottom of the contact layer or the filling of the contact trench of the upper chip is directly applied to the top of the contact layer or the filling of the lower chip. This makes electrical through contacting through the chip stack possible.

By using a plurality of contact layers or fillings suitably arranged in the contact trench, a Faraday shield may be produced. To this end, the sensor element or the circuit may be enclosed by this shield. This would prevent external electrical fields from interfering with or distorting the detection and/or the evaluation of sensor data or also other data.

Using the method according to the present invention makes it possible to manufacture any thin semiconductor elements, to stack them vertically on top of each other, and to electrically connect them to one another. In addition, it is also possible to integrate heat sink structures via the contact layers.

Moreover, the method according to the present invention is compatible with standard circuitry processes. The chips produced in this way offer advantages in the stacking density and the pulse frequency to be implemented in a 3-D integration due to the thin design. In addition, the method may be implemented more cost-effectively because a separate process step for thinning the substrate is omitted.

DETAILED DESCRIPTION OF THE INVENTION

Due to the efforts in micromechanics and microelectronics to accommodate more and more functions and circuits in tighter spaces, it is desirable to achieve high stacking densities in chip stacks. This is achieved, among other things, by designing the individual chips to be thinner and thinner.

Current methods for implementing thin chips initially create the desired sensor and circuit elements on substrates or layer stacks of normal thickness. After completion of these elements on the front side, the substrates or the layer stacks are then thinned from the back side in another, somewhat complex process. Among other things, mechanical methods such as grinding or polishing, but also (electro-) chemical methods are used here.

According to the present exemplary embodiment, another option for producing thin chips, in particular semiconductor chips, is described.

Figure 1:
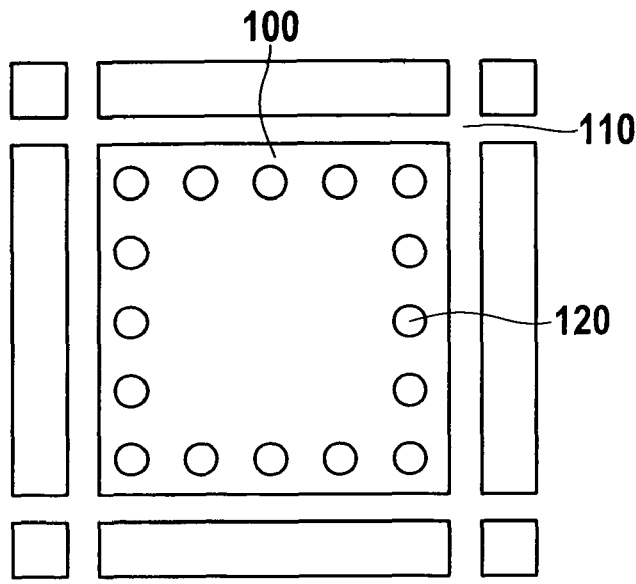
FIG. 1 shows a top view onto a chip according to the present invention prior to separation.

FIG. 1 shows the top view onto a chip 100 after execution of the method according to the present invention prior to the final separation. The contact trenches or fillings 120 of the contact trenches are clearly visible here. Furthermore, separation trenches 110 are shown which produce the lateral boundary of chip 100.

Figure 2A:
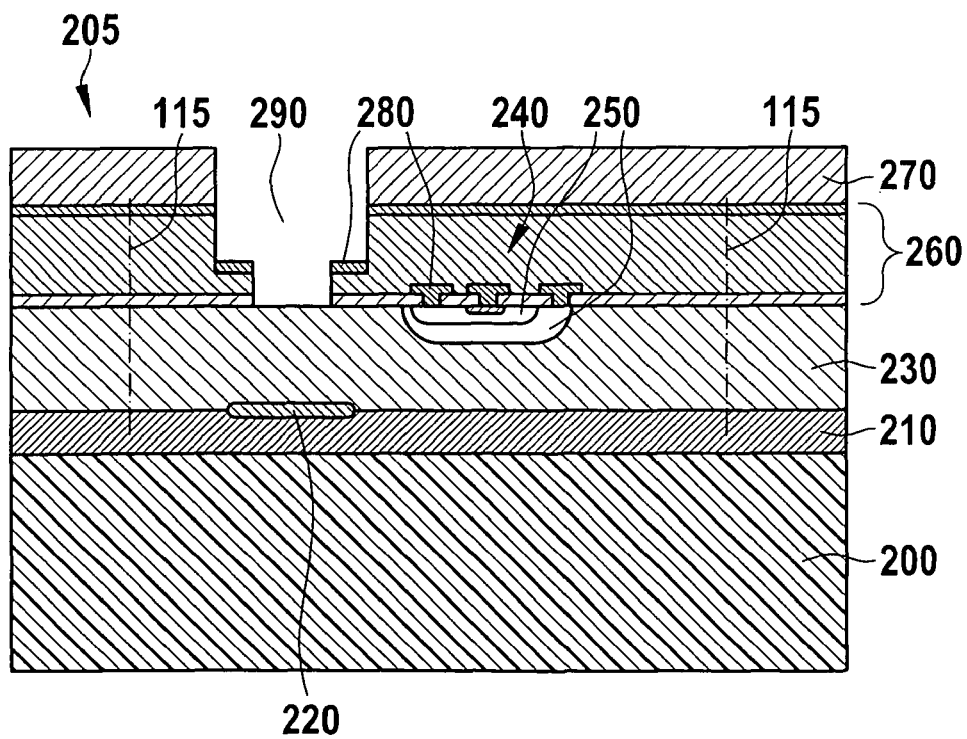
FIGS. 2a through 2f show various process steps of the manufacturing method of the chip according to the present invention.

As is schematically shown in FIG. 2a, a sacrificial layer 210 is applied to front side 205 of a substrate 200 using typical micromechanical methods. The substrate may be made of a semiconductor material as well as a metal. An epitaxy layer 230 is subsequently applied to sacrificial layer 210. Optionally it may also be provided to apply a spatially limited etching stop layer 220 and 225, of SiO$_2$, for example, in the area of the future contact trenches and/or separation trenches 115. For producing circuit elements 240 or sensor elements, current circuitry processes or micromechanical processes may be used which form, for example, different diffusion areas and hollow spaces 250 in epitaxy layer 230 and/or in additional passivation layers 260 of epitaxy layer 230. In the subsequent step, an opening 290 is introduced into passivation layers 260 in the area of the contact trenches to be produced via an appropriate masking layer 270. For contacting circuit elements and sensor elements 240 with the through contacts according to the present invention, several of the openings in a plurality of contact trenches may be provided with a metal plating 280 which establishes an electrical connection to elements 240.

Figure 2B:
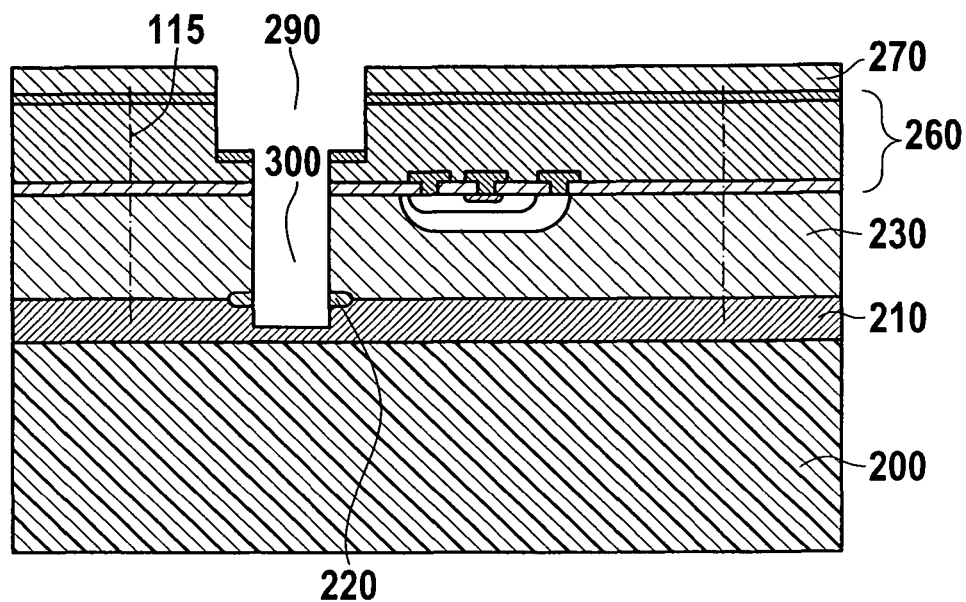

As shown in FIG. 2b, an anisotropic etching step is subsequently carried out which deepens opening 290 completely through epitaxy layer 230 at least up to sacrificial layer 210. For this purpose, etching stop layer 220 may optionally be used. However, in order to enable a quicker removal of the sacrificial layer material, contact trench 300 produced in this way should reach into sacrificial layer 210. Due to such a design, the etching material is provided with a larger attack area.

Figure 2C:
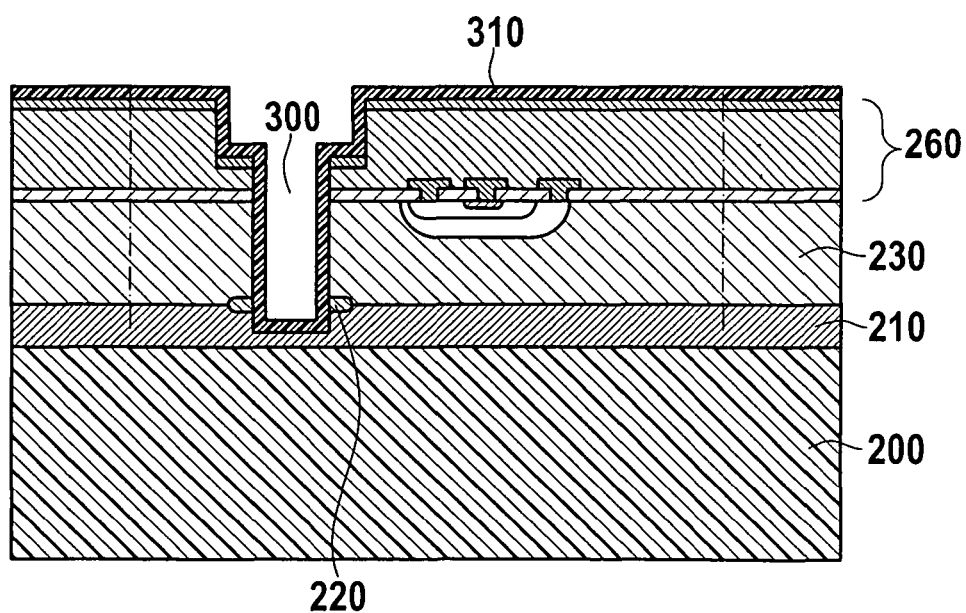

After masking layer 270 is removed, a conforming insulating layer 310 is applied which is supposed to achieve an electrical or thermal insulation between through contact 320 and epitaxy layer 230 (see FIG. 2c). Such insulating layers may be produced epitaxially or also via oxidation.

Figure 2D:
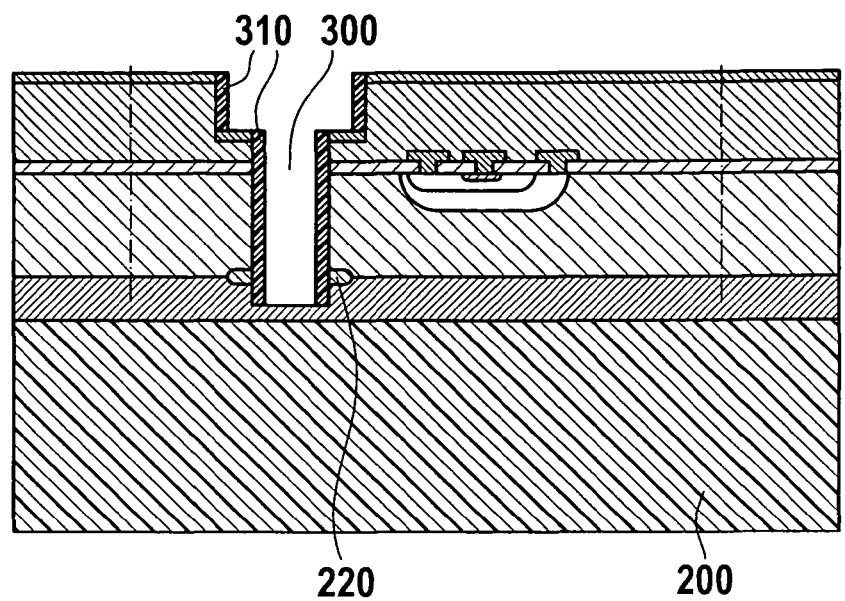

Insulating layer 310 is subsequently partly removed via an anisotropic etching step, so that only the walls of contact trench 300 and possibly the walls of passivation layers 260 remain covered (see FIG. 2d).

Figure 2E:
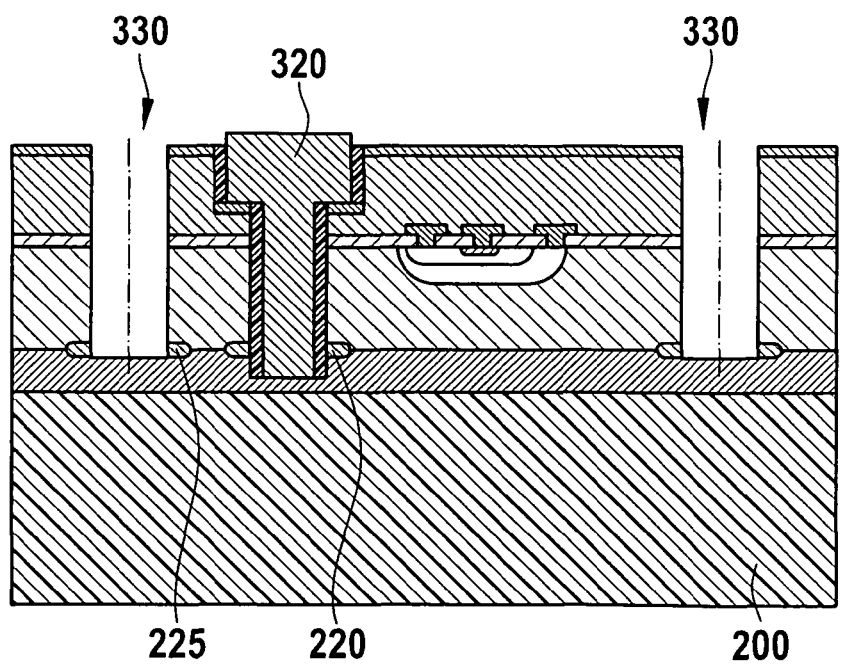

In a further method step, a conductive through contacting layer 320 is introduced for filling contact trench 300 (see FIG. 2e). This may be implemented, for example, by epitaxial methods, an electrochemical deposition of Cu, but also by vacuum melting of imprinted soldering paste. However, current CVD or PVD methods are additionally usable. A planarization of the metal plating or of the filling may optionally be carried out subsequently to this step, so that the surface of the layer stack is leveled.

For producing separation trenches 330, an anisotropic etching step is also provided which introduces a recess through passivation layers 260 as well as through epitaxy layer 230. As in producing contact trenches 300, the recess may be introduced into sacrificial layer 210, possibly with the aid of an etching stop layer 225.

Instead of separate anisotropic etching steps for producing contact trenches 300 and separation trenches 330, simultaneous etching may also take place, whereby the entire manufacturing process may be shortened.

Figure 2F:
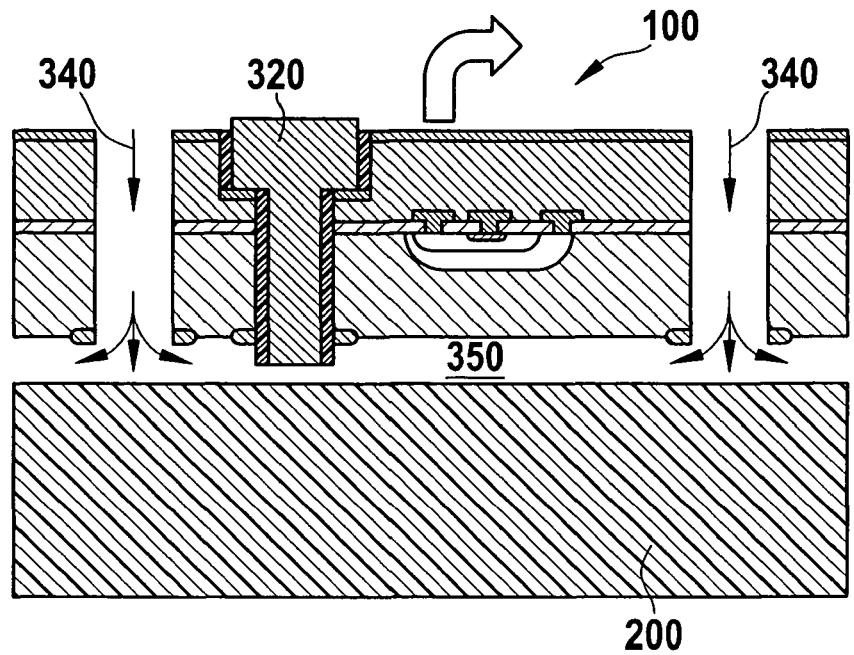

After introduction of separation trenches 330 which enclose chip 100, as apparent from FIG. 1, chip 100, composed of layer stacks 230 and 260, has mechanical contact with substrate 200 only via sacrificial layer 210. For separating the chip from substrate 200, it is necessary to remove the sacrificial layer material. Such a removal is shown in FIG. 2f. For this purpose, a suitable gas, such as, for example, ClF$_3$ or XeF$_2$, is conducted from front side 205 through separation trenches 330 to sacrificial layer 210 with the aid of a gas phase etching process 340. Due to the reaction produced thereby, the sacrificial material disintegrates and escapes through separation trenches 330. Once layer 350 no longer has a mechanical connection between chip 100 and substrate 200, chip 100 may be removed. The substrate is, therefore, possibly after an appropriate cleaning process, recyclable for the manufacture of additional chips of the type according to the present invention.

Figure 3:
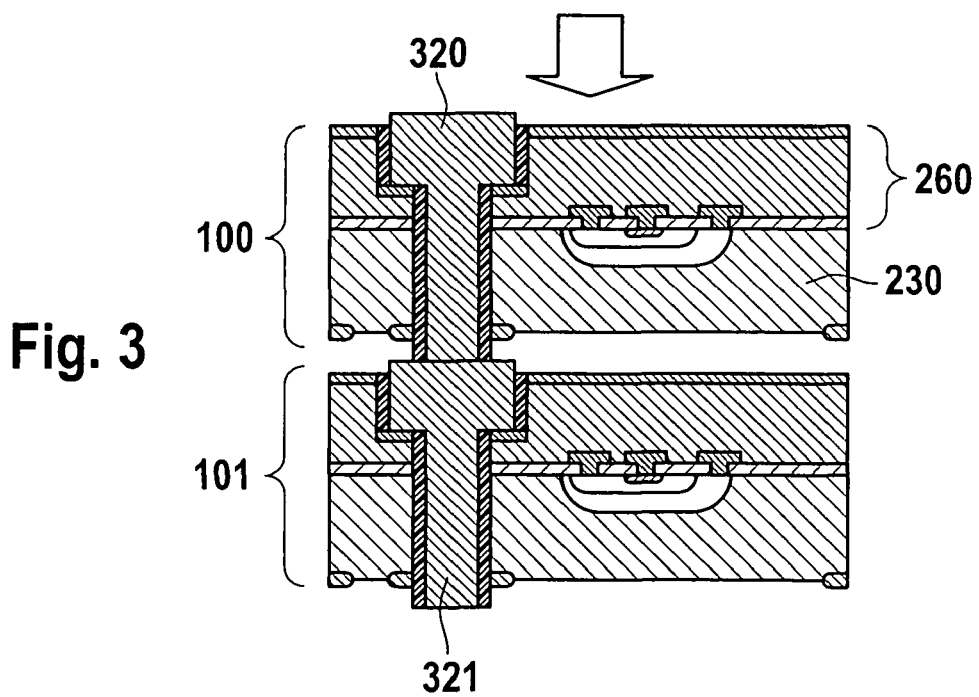
FIG. 3 shows, as an example, the combination of a chip stack having two chips.

FIG. 3 shows as an example a connection of multiple chips according to the present invention. A first chip 100 is placed on a second chip 101 in such a way that the two through contacts 320 and 321 are electrically and/or thermally in contact with one another. Such connections are possible by using thermocompression bonding, for example.

As is apparent from FIG. 3, the depth to which contact trenches 300 are introduced into sacrificial layer 210 and the planarization of the metal plating or filling may define the distance of both chips from each other in such a combination.

In a particular exemplary embodiment, a sensor element and/or a circuit element is/are produced in chip 100 which responds sensitively to external electrical fields. In order to prevent such interference or to prevent it as much as possible it is provided that this element be furnished with a plurality of contact trenches 120, as is shown in FIG. 1; of course, besides a largely rectangular arrangement, a round or oval arrangement may also be provided. By vertically enclosing the element with through contacts, a Faraday shield may thus be achieved which enables detection by the sensor element and/or processing of the signals in the circuit with higher signal quality.

However, it is additionally also possible that multiple through contacts are provided in the chip, which each separately conveys a signal through the chip. Conceivable here are different potentials or pieces of information, for example.

In another exemplary embodiment, the through contacts are used, at least partially, to conduct heat from one chip side to the other. In particular in the event of multiple through contacts, it may be provided that some of the passages are used for electrical signals and other passages are used for heat transfer.

What is claimed is:

1. A method for manufacturing at least one micromechanical chip, comprising:
   applying a sacrificial layer to a front side of a substrate;
   applying an epitaxy layer to the sacrificial layer, a bottom side of the epitaxy layer contacting the sacrificial layer;
   etching at least one contact trench from a top side of the epitaxy layer through the epitaxy layer;
   producing an insulating layer on the walls of the at least one contact trench;
   producing a contact layer in the contact trench, wherein the contact layer provides a conductive connection from a front side of the micromechanical chip to the sacrificial layer;
   etching separation trenches from the top side of the epitaxy layer through the epitaxy layer to the sacrificial layer; and
   removing the sacrificial layer.

2. The method as recited in claim 1, wherein the epitaxy layer has a layer thickness of 1 µm to 50 µm.

3. The method as recited in claim 2, wherein at least one of the contact trench and the separation trench is produced using an anisotropic etching process, and wherein the etching of the contact trench and the etching of the separation trenches are carried out simultaneously.

4. The method as recited in claim 2, wherein the separation trenches have a greater extension at least in one lateral direction compared to the contact trench.

5. The method as recited in claim 3, wherein multiple contact trenches spaced apart from one another and having respective contact layers are produced in the epitaxy layer.

6. The method as recited in claim 3, wherein at least one of a circuit and a sensor element is applied on the epitaxy layer using a micromechanical process, and wherein multiple contact trenches are produced around the at least one of the circuit and the sensor element.

7. The method as recited in claim 3, wherein the contact layer is produced by one of an electrochemical method, a CVD method, an imprinting or remelting in a vacuum.

8. The method as recited in claim 3, wherein the sacrificial layer satisfies at least one of the following conditions: (a) has a pseudomorphous structure; (b) is conductive; (c) contains SiGe; and (d) is removed using a gas phase etching process.

9. The method as recited in claim 3, wherein the micromechanical chip including at least the epitaxy layer and at least one contact trench having a contact layer and an insulating layer in the epitaxy layer is separated from the substrate by removing the sacrificial layer.

10. The method as recited in claim 3, wherein at least two micromechanical chips are manufactured, and wherein the micromechanical chips are connected to one another using a bonding method, and wherein the contact layers of the two micromechanical chips have an electrical contact.

* * * * *